United States Patent
Cao et al.

(10) Patent No.: US 6,760,394 B1
(45) Date of Patent: Jul. 6, 2004

(54) CMOS LOCK DETECT WITH DOUBLE PROTECTION

(75) Inventors: Jun Cao, Irvine, CA (US); Afshin Momtaz, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 808 days.

(21) Appl. No.: 09/632,665

(22) Filed: Aug. 7, 2000

Related U.S. Application Data

(60) Provisional application No. 60/148,415, filed on Aug. 11, 1999.

(51) Int. Cl.[7] .................................................. H03D 3/24
(52) U.S. Cl. ................. 375/374; 375/376; 331/DIG. 2; 331/25; 327/156; 327/159
(58) Field of Search ............................ 331/DIG. 2, 25; 327/1, 141, 147, 151, 156, 159, 339; 375/354, 371, 373, 374, 375, 376

(56) References Cited

U.S. PATENT DOCUMENTS

| | | | |
|---|---|---|---|
| 5,327,103 A | * | 7/1994 | Baron et al. ................. 331/1 A |
| 5,406,592 A | * | 4/1995 | Baumert ....................... 375/376 |
| 5,656,977 A | * | 8/1997 | Kelkar et al. ................. 331/25 |
| 5,799,049 A | | 8/1998 | McFarland et al. |
| 5,896,428 A | * | 4/1999 | Yanagiuchi ................. 375/374 |
| 5,905,410 A | * | 5/1999 | Holmes et al. ............. 331/1 A |
| 5,943,613 A | | 8/1999 | Wendelrup et al. |
| 6,100,721 A | | 8/2000 | Durec et al. |
| 6,259,290 B1 | * | 7/2001 | Takada et al. ............... 327/158 |
| 6,314,150 B1 | * | 11/2001 | Vowe ......................... 375/374 |
| 6,320,469 B1 | * | 11/2001 | Friedberg et al. ........... 331/1 A |

FOREIGN PATENT DOCUMENTS

JP        8-97717    *  8/1996

* cited by examiner

Primary Examiner—Jean B. Corrielus
(74) Attorney, Agent, or Firm—Christie, Parker & Hale, LLP

(57) ABSTRACT

Method and circuitry for improving the accuracy and efficiency of a phase-locked loop. More specifically, the present invention relates to a method and device for monitoring the frequency discrepancy between two signals in conjunction with at least one data signal so as to improve the accuracy and efficiency of a phase-locked loop. In one embodiment of the present invention, two counters are used to check the frequency differential between a VCO signal and an external reference or input signal. An adjustable threshold is provided to determine whether the frequencies of the two signals are considered to be in a frequency-locked mode. A pair of flip-flops is used to minimize any erroneous detection of frequency discrepancy by validating two consecutive results of the frequency differential check. In addition, a data present signal is used to control the transition between the phase-locked mode and the frequency-locked mode to minimize the potential data loss.

47 Claims, 5 Drawing Sheets

CM OS LOCK DETECT WITH DOUBLE PROTECTION

CROSS-REFERENCES TO RELATED APPLICATIONS

This application claims the benefit of priority under 35 U.S.C. §119 from U.S. Provisional Patent Application Serial No. 60/148,415 filed on Aug. 11, 1999, the disclosure of which is hereby incorporated by reference in its entirety for all purposes.

BACKGROUND OF THE INVENTION

The present invention relates to improving the accuracy and efficiency of a phase-locked loop. More specifically, the present invention relates to a method and device for monitoring the frequency discrepancy between two signals in conjunction with at least one data signal so as to improve the accuracy and efficiency of a phase-locked loop.

A phase-locked loop (PLL) is a circuit that is capable of synchronizing an output signal generated by an oscillator with a reference or input signal in frequency as well as in phase. FIG. 1 shows a simplified block diagram of the functional elements of a conventional PLL. A conventional PLL generally includes a voltage-controlled oscillator (VCO) 10, a phase detector 12, and a loop filter 14. A PLL uses feedback to maintain an output signal in a specific phase with a reference signal. The VCO 10 generally oscillates at an angular frequency which is determined by the output signal 20 of the loop filter 14 which, in turn, is controlled by the output signal 18 of the phase detector 12. In turn, the output 22 of the VCO 10 and the external reference or input signal 16 dictate the output signal 18 of the phase detector 12. Hence, if the phase error between the VCO output 22 and the external reference or input signal 16 is not zero or within a tolerable margin, the phase detector 12 will develop a nonzero output 18, thereby via the loop filter 14 causing the VCO 10 to produce an output signal 22 that is synchronized or locked with the external reference or input signal 16 and reducing the phase error to an acceptable level.

The process of achieving a lock between the VCO output 22 and the external reference or input signal 16 involves two steps. First, the frequencies of the two signals 16, 22 have to be matched. When the two frequencies are matched, the two signals 16, 22 are sometimes referred to as being in a frequency-locked mode. Once the frequency-locked mode is achieved, the phases of the two signals 16, 22 are then matched thereby achieving a phase-locked mode. In other words, the frequency-locked mode is a prerequisite to achieving the phase-locked mode. Once the phase-locked mode is achieved, the PLL can then perform its intended functions.

PLLs are used in many applications including frequency synthesis, modulation, demodulation, and data and clock recovery. For example, in digital communications, it is frequently necessary to extract a coherent clock signal from an input data stream. A PLL is often used for this task by locking a VCO output to the input data stream. Once locked, the VCO output is essentially the clock signal of the input data stream and thus can then be used to extract the data bits from the input data stream.

Quite often, however, two signals for a variety of reasons may disengage from the phase-locked mode. This can happen when the two signals are no longer in frequency-locked mode. For example, when a data signal becomes jittery or disappears entirely, the frequencies of the data signal and the VCO signal can no longer match, thereby causing the two signals to disengage from the frequency-locked mode and subsequently from the phase-locked mode. Therefore, it would be desirable to provide a method and device that is capable of reliably detecting whether two signals are in frequency-locked mode thereby ensuring that the phase-locked mode is maintained.

In addition, different systems often require different degrees of precision to achieve a frequency-locked mode depending on the purposes of the systems. Some systems may require two signals to be closely matched before a frequency-locked mode is considered achieved, while others may permit a wider margin of matching. Therefore, it would be desirable to provide a method and device that is capable of having an adjustable threshold for determining whether a frequency-locked mode is achieved.

Further, as mentioned above, before a PLL can perform its intended functions, it must be engaged in a phase-locked mode first which, in turn, requires as a prerequisite a frequency-locked mode to be achieved. Conversely, a phase-locked mode is disengaged when the prerequisite frequency-locked mode is no longer present. Any unnecessary or mistaken disengagement of the frequency-locked mode thus disrupts the phase-locked mode and consequently prevents the PLL from performing its intended functions. Therefore, it would be desirable to provide a method and device that is capable of efficiently monitoring the activation of the frequency-locked mode so as to optimize the continued operation of a PLL.

Moreover, very often when a PLL is engaged in a phase-locked mode and no data is available for detection, the VCO signal tends to drift and eventually will no longer be considered to be in frequency-locked mode with the external reference or input signal. During this period when the frequency-locked mode is lost, a PLL is not capable of detecting incoming data and such data are thus lost. When this occurs, the phase-locked mode has to be disengaged so as to allow the frequency-locked mode to be reestablished so that as soon as data is available, the PLL can switch to the phase-locked mode to capture the data. Therefore, it would be desirable to provide a method and device that is capable of efficiently monitoring and controlling the transition between the phase-locked mode and the frequency-locked mode so as to minimize data loss. The present invention satisfies the above as well as other needs.

SUMMARY OF THE INVENTION

The present invention seeks to efficiently control the transition between the phase-locked mode and the frequency-locked mode during the operation of a PLL. In one embodiment of the present invention, two counters are used to check the frequency differential between a VCO signal and an external reference or input signal. The external reference or input signal and the VCO signal are used to drive the two counters respectively. Both counters conduct count-downs in a cyclic manner. When the first counter arrives at an identifiable position in its count-down, the second counter is directed to begin its count-down from a predetermined position. When the first counter once again reaches the same identifiable position, the output of the second counter is checked to determine the differential between such output and the identifiable position of the first counter. Such differential can be selectively interpreted to provide an adjustable threshold to determine whether the frequencies of the two signals are considered to be in a frequency-locked mode.

The result of the frequency differential check is propagated through a pair of flip-flops. The pair of flip-flops are connected in series. Hence, the pair of flip-flops records the results of any two consecutive frequency differential checks.

The outputs of the two flip-flops are logically combined to a logic element which produces a low signal when both outputs of the flip-flops are high. In one exemplary implementation, a NAND logic function is provided to accept the output signals of the pair of flip-flops. The NAND logic function produces a low signal only when the results of both frequency differential checks are high, meaning that remedial action should be taken to rectify the frequency-locked mode. This provides the advantage that erroneous detection of a frequency discrepancy is minimized. This also provides the advantage that the PLL is given additional time to pull in the locked frequency when the PLL switches from the frequency-locked mode to the phase-locked mode.

In addition, a data present signal is logically combined with the output of the NAND logic function. An AND logic function, for example, produces a high signal only when both the data present signal and the output of the NAND logic function are high, meaning that data are present for detection and there is no frequency discrepancy. This, in turn, signifies that the phase-locked mode should be maintained. This minimizes unnecessary transition between the phase-locked mode and the frequency-locked mode thereby reducing the likelihood of data loss.

Reference to the remaining portions of the specification, including the drawings and claims, will realize other features and advantages of the present invention. Further features and advantages of the present invention, as well as the structure and operation of various embodiments of the present invention, are described in detail below with respect to accompanying drawings, like reference numbers indicate identical or functionally similar elements.

DESCRIPTION OF THE SPECIFIC EMBODIMENTS

Figure 1:
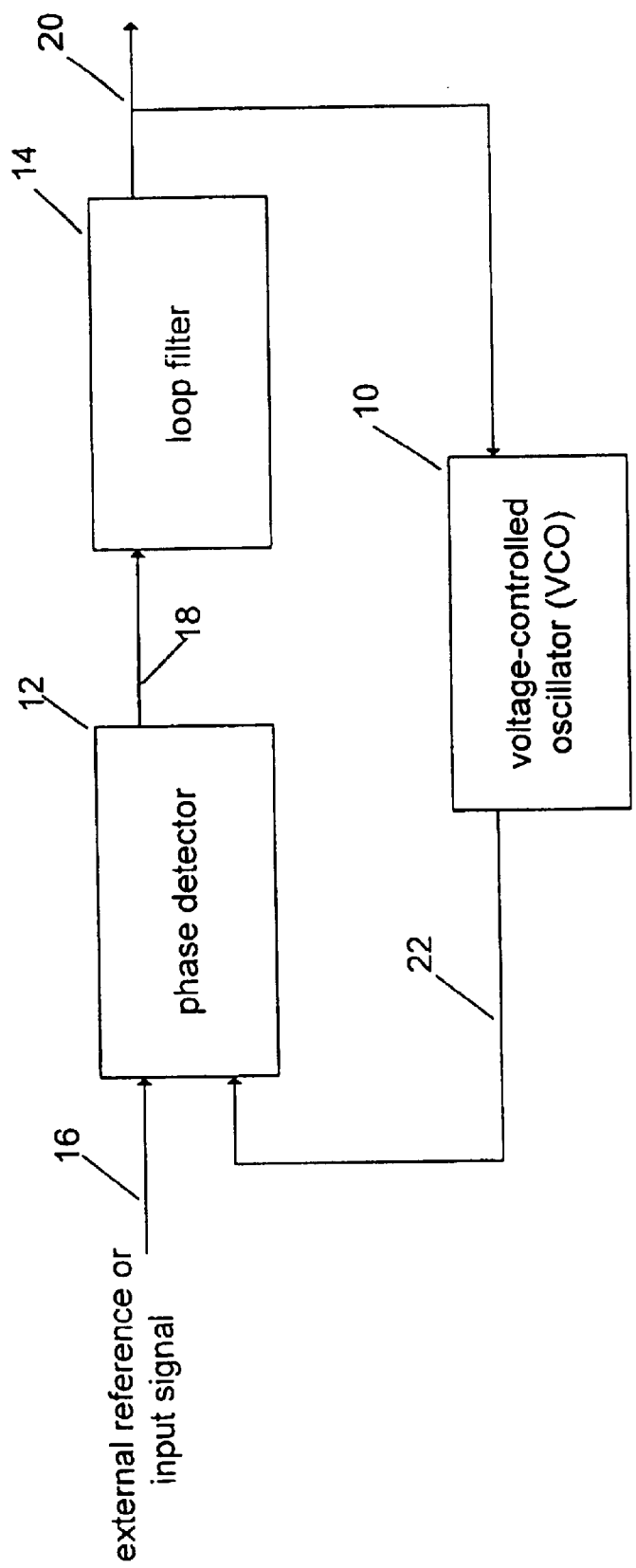
FIG. 1 shows a simplified block diagram of the functional elements of a conventional PLL.
Figure 2:
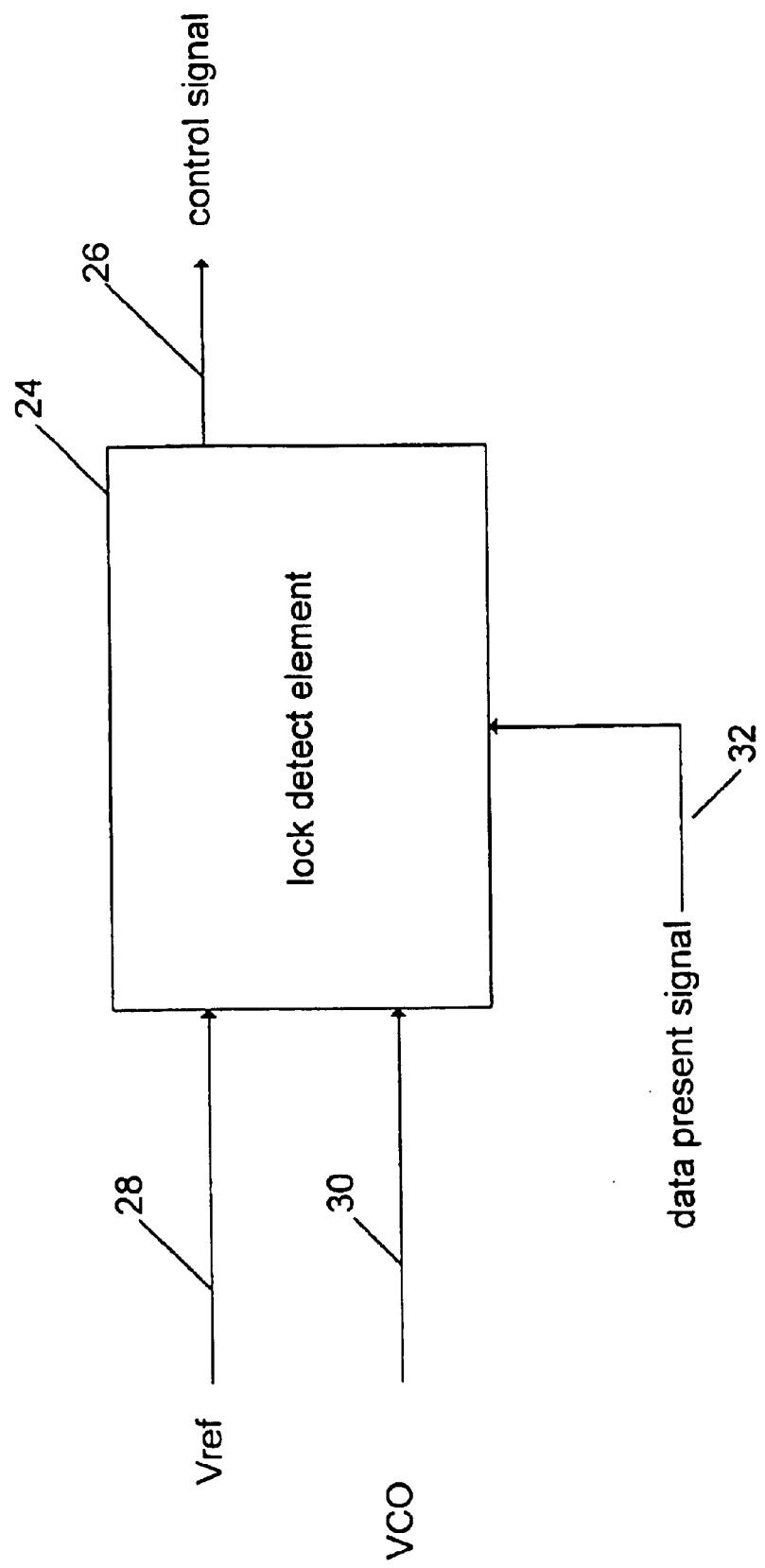
FIG. 2 shows a simplified functional block diagram of one embodiment of the present invention.

The present invention will now be described. FIG. 2 shows a simplified functional block diagram of one embodiment of the present invention. The function of the lock detect element 24 is to produce a control signal 26 to indicate whether the frequency-locked mode or the phase-locked mode should be engaged.

The lock detect element 24 accepts as inputs an external reference clock signal (Vref) 28 and a VCO signal 30. In circuit applications, such as in high frequency fiber optic communication networks, the VCO signal 30 may be in the gigahertz range. In such applications, it is preferable to divide down the frequency of the VCO signal 30 by a certain predetermined factor, for example, 32 or 16, so as to make frequency matching with Vref 28 more manageable. The frequencies of Vref 28 and the VCO signal 30 are designated respectively as fref and fvco.

The lock detect element 24 then compares fref and fvco to determine if the frequency differential between them is within an adjustable predetermined threshold. Such adjustable predetermined threshold is dependent on the requirements of the system which uses the PLL. If the frequency differential is within the adjustable predetermined threshold, then the phase-locked mode is maintained; otherwise, certain mechanism may be triggered to engage the Vref 28 and the VCO signal 30 into the frequency-locked mode. Details with respect to detecting the difference between fref and fvco will be more fully described below.

Figure 3:
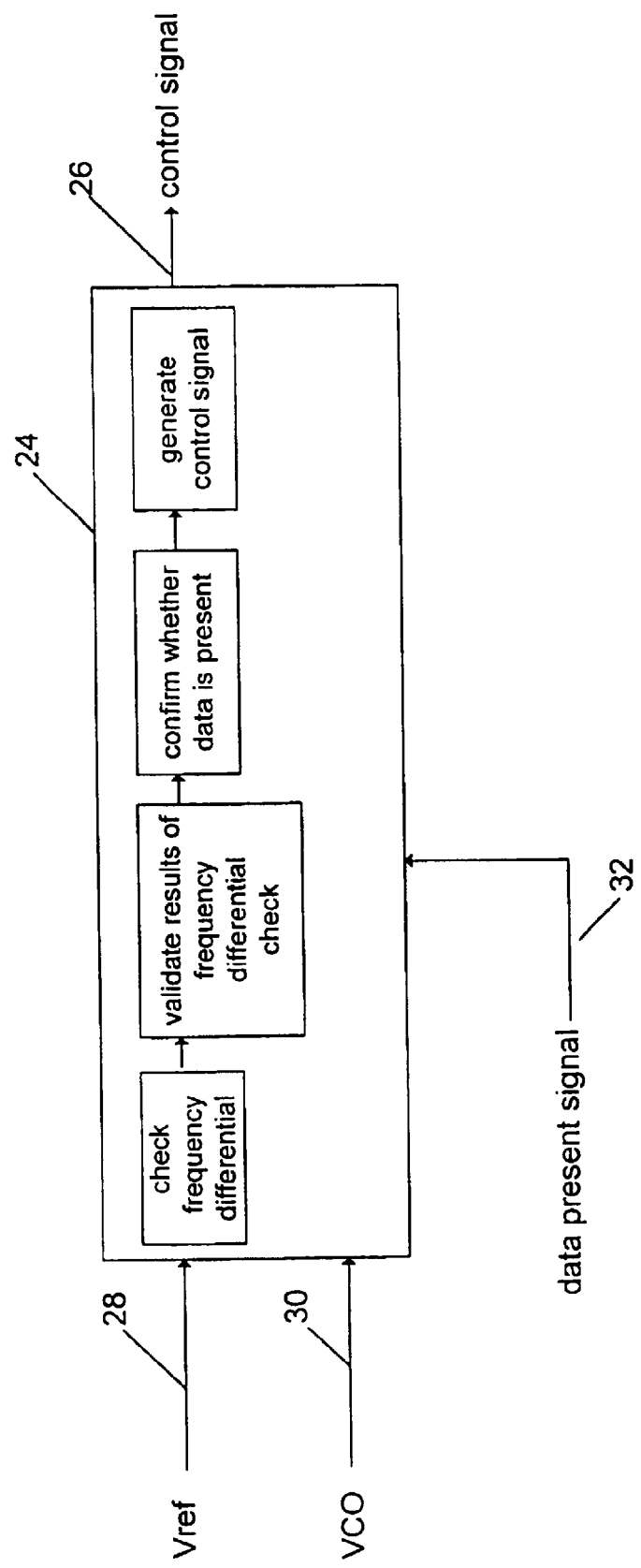
FIG. 3 is a simplified functional block diagram showing the functional components of one embodiment of the present invention.

FIG. 3 is a simplified functional block diagram showing the functional components of the lock detect element 24 in accordance with the present invention. The lock detect element 24 generally performs four basic functions 34, 36, 38 and 40, namely, checking the frequency differential of the Vref 28 and the VCO signal 30, validating the results of the frequency differential check, confirming whether data is present, and generating the appropriate control signal 26 to control the transition between the phase-locked mode and the frequency-locked mode.

Figure 4:
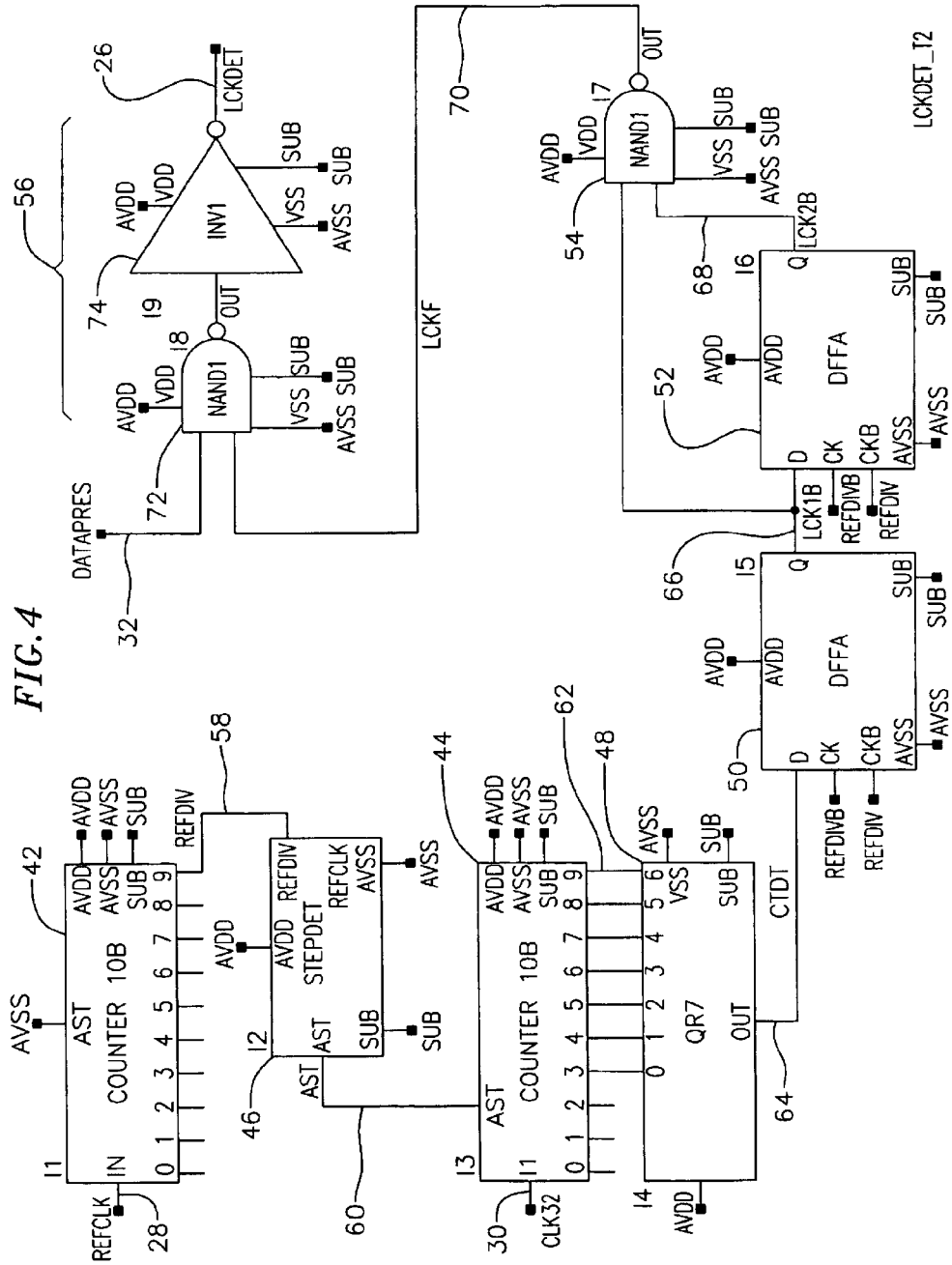
FIG. 4 is a simplified schematic block diagram showing one embodiment of the present invention.

FIG. 4 is a simplified schematic block diagram showing one exemplary embodiment of the present invention. This embodiment includes two digital counters 42, 44, a step detector 46, a bits checker 48, two flip-flops 50, 52, a NAND logic function 54, and an AND logic function 56.

A first counter 42 feeds the most significant bit (MSB) 58 of its output to a step detector 46. The output 60 of the step detector 46 is connected to the second counter 44. Selected output bits 62 of the second counter 44 are then fed into a bits checker 48. As will be explained below, the use of these selected output bits 62 provides the ability to control the amount of adjustable threshold to be used to determine whether Vref 28 and the VCO signal 30 are in a frequency-locked mode. The output 64 of the bits checker 48 is connected to a first flip-flop 50. The output 66 of the first flip-flop 50 is entered into a second flip-flop 52. The outputs 66, 68 of both flip-flops 50, 52 are accepted as inputs by a NAND logic function 54. The result 70 of the NAND logic function 54 together with a data present signal 32 are then fed into an AND logic function 56 to produce a control signal 26. The significance of the data present signal 32 will be more fully explained below.

The operation of the embodiment of the present invention as shown in FIG. 4 will now be described. The signal Vref 28 is fed into the first counter 42 to initiate a count-down. The first counter 42 performs the count-down in a cyclic manner. In other words, the first counter 42 counts down to zero and then repeats the count-down from the largest number that it can handle. The count-down can start with an arbitrary number and the speed of the first counter 42 is controlled by the frequency of Vref 28 which is fref. During the count-down, the output bits of the first counter 42 change with the clock signal, i.e., Vref 28, to generate the count.

As previously noted, the output MSB 58 of the first counter 42 is connected to the input of the step detector 46. The function of the step detector 38 is to detect a rising step change in its input, i.e., the output MSB 58. A rising step change means a change from a low ("0") to a high ("1"). There is only one instance during the count-down when the output MSB 58 of the first counter 42 changes from a low to a high. That instance occurs when the first counter 42 reaches zero and restarts the count-down at the largest possible number. For example, for a 4-bit counter, the transition is from "0000" to "1111". This is the point where the precise value of the first counter 42 is known when only the output MSB 58 is monitored. Monitoring other output bits of the first counter 42 individually does not allow the value of the first counter 42 to be determined precisely because these other bits can go from a low to a high in many instances during the count-down. Hence, by having the output MSB 58 of the first counter 42 connected to the input of the step detector 46, the transition from the smallest number to the largest number during the count-down can be detected by the step detector 46. By being able to pinpoint this particular transition, a reliable starting point can be established to test the frequency differential between fref and fvco. Upon detecting the rising step change due to the output MSB 58 of the first counter 42, the step detector 46 signals to a second counter 44 to initiate a count-down by the second counter 44.

Figure 5:
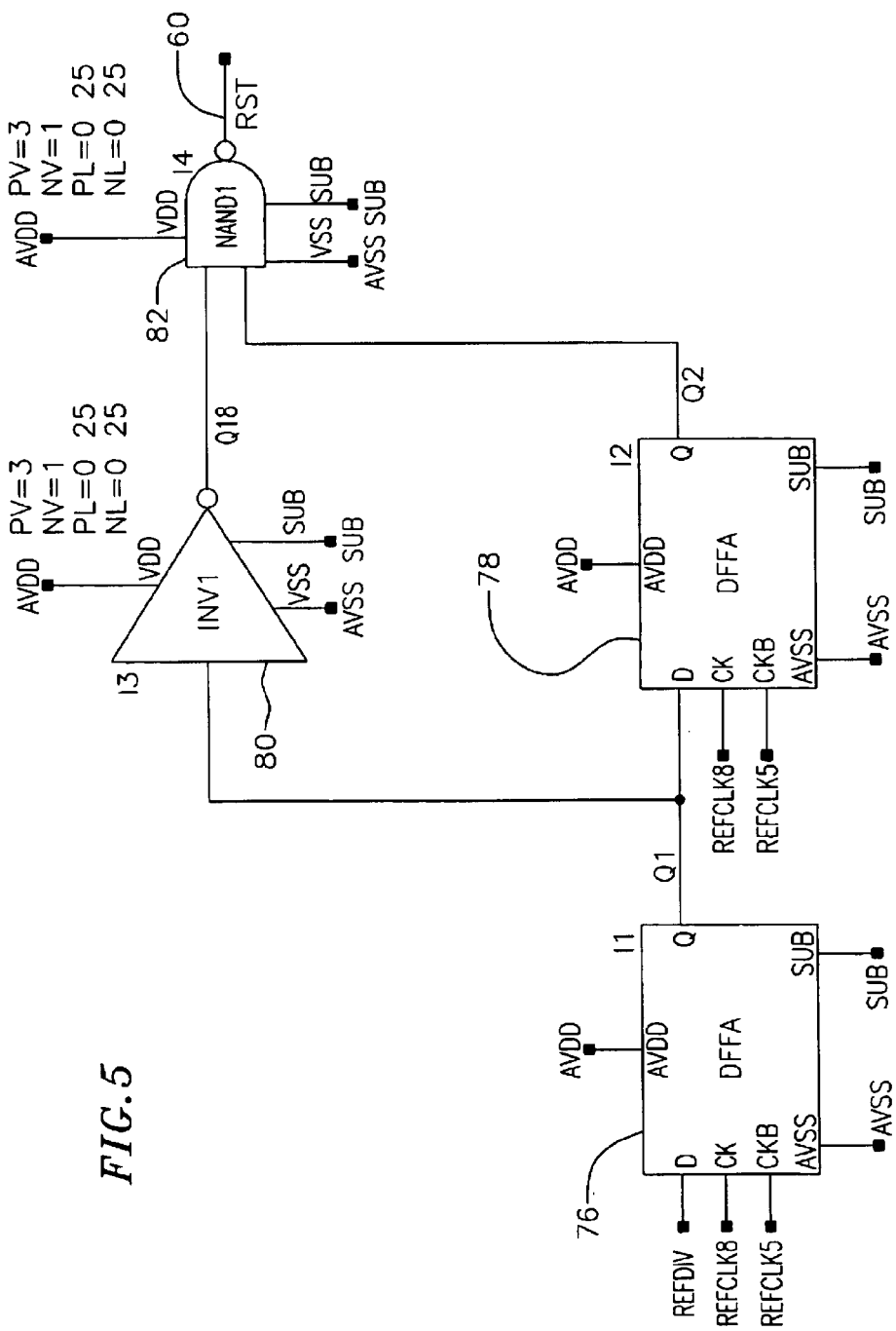
FIG. 5 is a logic circuit diagram illustrating one particular component of one embodiment of the present invention.

FIG. 5 shows a logic circuit which can be used to implement the step detector 46. This logic circuit can be used in conjunction with the first counter 42 which performs a count-down function. In this embodiment, the step detector 46 includes a pair of flip-flops 76, 78, an inverter 80, and a NOR logic function 82. The two flip-flops 76, 78 are connected in series. The input to the flip-flop 76 is the output MSB 58 of the first counter 42. One output of the flip-flop 76 is coupled to the inverter 80. The output of the inverter 80 and the output of the flip-flop 78 are then combined as inputs to the NOR logic function 82. The output of the NOR logic function 82 is the output 60 of the step detector 46. The operation of the step detector 46 as implemented by this logic circuit is straightforward. It can be easily seen that the only instance when the output of the NOR logic function 82 is high is when the output of the flip-flop 76 is high and the output of the flip-flop 78 is a low, meaning that the output MSB 58 of the first counter 42 has transitioned from a "0" to a "1".

Prior to receiving the count-down initiation signal 60 from the step detector 46, the second counter 44 is held in reset. When the count-down initiation signal 60 is received from the step detector 46, the second counter 44 similarly begins a count-down sequence beginning from a predetermined number set by the system designer. This predetermined number is related to the adjustable threshold and its significance will be explained below. The speed of the second counter 44 is driven by the VCO signal 30 whose frequency is fvco.

At the moment that the second counter 44 is instructed to start counting, the value of the first counter 42 is known. As mentioned above, in order to start the second counter 44, the step detector 46 must have detected a rising step change from the output MSB 58 of the first counter 42 which, in turn, means that the first counter 42 is about to turn over its count-down sequence and begin from the largest possible number again. By starting the second counter 44 at that point, the frequency differential between fref and fvco can be determined because the precise starting points of the two counters 42, 44 are known.

After the second counter 44 initiates its count-down, the first counter 42 continues its own count-down. When the first counter 42 completes one count-down cycle (i.e., when the step detector 46 detects another rising step change from the output MSB 58 of the first counter 42), the output bits 62 of the second counter 44 are checked by the bits checker 48 to determine where the second counter 44 is in its count-down cycle. At that moment, the first counter 42 is known to be at its smallest possible number, i.e., "0", so the output bits 62 of the second counter 44 are checked to see if they represent a "0" as well. The bits checker 48 can be implemented using, for example, an OR logic function to perform this check. Hence, by examining the second counter 44 at that point, it can be determined how far apart the two frequencies, fref and fvco, are.

It should be noted that the check performed by the bits checker 48 is affected by the initial predetermined number from which the count-down of the second counter 44 begins. The result 64 of the bits checker 48 has to be adjusted accordingly based on the difference between the initial predetermined number of the second counter 44 and the initial count-down number of the first counter 42 (which is usually "0") when the count-down of the second counter 44 begins.

It should be further understood that the frequency differential check can be similarly performed using counters which count up in a cyclic manner and a step detector which detects a transition from a "1" to a "0". In fact, any combination of logic elements can be used as long as an identifiable position can be repeatedly ascertained during count cycles.

The number of output bits 62 of the second counter 44 that need to be examined depends on the desired amount of threshold within which the frequency differential of fref and fvco must fall if fref and fvco are to be considered in a frequency-locked mode. If a very precise threshold is required, more output bits, or perhaps the entire output of the second counter, may need to be checked. If a more lenient threshold is permitted, then only the more significant output bits may need to be examined and the less significant output bits can be ignored. Hence, by selectively examining the number of output bits 62 of the second counter 44, an adjustable threshold can be implemented depending on the desired precision of the frequency-locked mode.

The result 64 produced by the bits checker 48 is then recorded by the first flip-flop 50. For example, if all the examined output bits 62 of the second counter 44 are "0's", then a result of "0" is produced by the bits checker 48. This indicates that the two frequencies, fref and fvco, are within the allowable threshold and thus in frequency-locked mode. Otherwise, a "1" is produced indicating a frequency discrepancy. On the next rising step change of the output MSB 58 of the first counter 42, the result 66 of the first flip-flop 50 is passed onto the second flip-flop 52 and a new result 64 from the bits checker 48 is passed into the first flip-flop 50. The outputs 66, 68 of the two flip-flops 50, 52 are fed into the NAND logic function 54.

The combination of the two flip-flops 50, 52 and the NAND logic function 54 provides protection against erroneous detection of frequency discrepancy and thus prevent the unnecessary initiation of measures to put the two frequencies, fref and fvco, back into frequency-locked mode. For example, erroneous detection of frequency discrepancy can occur when a noise burst corrupts the result 64 produced by the bits checker 48.

By connecting the two flip-flops 50, 52 in series, two consecutive results of the frequency differential checks performed by the bits checker 48 are maintained. The NAND logic function 54 interprets these two consecutive results 66, 68 and produces a signal 70 to initiate steps to rectify the frequency-locked mode only when both results 66, 68 indicate that there is a frequency discrepancy. For example, if one of the two consecutive results 66, 68 from the bits checker 48 is a "0" indicating that there is a frequency match, then the NAND logic function 54 by its nature of operation will produce a high signal, i.e., a "1".

The only time the NAND logic function 54 produces a low signal or a "0" is when both its inputs 66, 68 are high or "1's". Hence, in order for the NAND logic function 54 to generate a low signal, both consecutive results 66, 68 from the bits checker 48 have to be high indicating a frequency discrepancy in both instances. The foregoing provides an advantage in preventing the system from engaging in any premature corrective measures when only one instance of frequency discrepancy exists. It should be further understood that to provide for increased accuracy in detecting frequency discrepancy, additional flip-flops may be used to record the history of the frequency differential check.

The output 70 of the NAND logic function 54 and the data present signal 32 are then fed into an AND logic function 56 to produce either a high signal indicating that the phase-locked mode should be maintained or a low signal indicating that the frequency-locked mode should be engaged. In one embodiment, the AND logic function 56 is implemented by using a NAND logic function 72 connected in series with an inverter 74. The operation of the AND logic function 56 produces a high control signal 26 only when both inputs 32, 70 are also high; in all other instances, the control signal 26 is low. Hence, the AND logic function 56 produces the high control signal 26 only when both the data present signal 32 is high indicating the presence of data and the output 70 of the NAND logic function 54 is high indicating that there is no frequency discrepancy. In all other cases, such as when the data present signal 32 is low indicating that no data is available, or the output 70 of the NAND logic function 54 is low indicating that there is a frequency discrepancy, or both, the control signal 26 produced by the AND logic function 56 remains low. A low control signal 26 generated by the AND logic function 56 signifies that the frequency-locked mode should be engaged.

The use of the data present signal 32 provides an additional measure of protection against undertaking premature actions to engage the phase-locked mode. As mentioned above, a PLL is often used to ascertain the proper clock signal frequency in order to retrieve data from an input data stream. When data is not present, the frequency-locked mode should be maintained and kept ready for retrieval of data. On the other hand, when data is present and there is no frequency discrepancy, then the phase-locked mode should be maintained to continue to retrieve data. By using the data present signal 32 as one of the inputs to the AND logic function 56, the phase-locked mode is not automatically engaged upon the determination that there is no frequency discrepancy between fref and fvco. This is significant because when the phase-locked mode is engaged with no data present, fvco will drift and eventually will no longer match fref. fref and fvco then have to be restored to the frequency-locked mode. Consequently, any data that comes in during this restoring period will be undetected and lost. In contrast to the situation where the frequency-locked mode is maintained and kept ready, when data becomes available, the phase-locked mode can be promptly engaged to capture the data. Hence, with the use of the data present signal 32, unnecessary transition between the phase-locked mode and the frequency-locked mode is minimized thereby reducing the likelihood of losing data.

It is understood that the examples and embodiments described herein are for illustrative purposes only and that various modifications or changes in light thereof will be suggested to persons skilled in the art and are to be included within the spirit and purview of this application and scope of the appended claims. All publications, patents, and patent applications cited herein are hereby incorporated by reference for all purposes in their entirety.

What is claimed is:

1. A lock detect circuit for a phase-locked loop, comprising:
   a first counter configured to generate a first binary count, said first counter being driven by a first signal;
   a second counter having a reset input coupled to one output bit of said first binary count, said second counter being driven by a second signal and configured to generate a second binary count on a plurality of output terminals; and
   a logic circuit having a plurality of inputs coupled to a selected number of said plurality of output terminals of said second counter;
   wherein an output of said logic circuit signals a frequency lock condition between a frequency of said first signal and a frequency of said second signal.

2. A lock detect circuit according to claim 1, wherein said frequency lock condition is represented by a range that is adjustable based on said selected number of said plurality of output terminals of said second counter.

3. A lock detect circuit according to claim 1, wherein said one output bit is the most significant bit (MSB) of said first binary count, and wherein said MSB is coupled to said reset input of said second counter via a transition detect circuit.

4. A lock detect circuit according to claim 3, wherein said transition detect circuit detects a change of said MSB of said first binary count from a first binary state to a second binary state.

5. A lock detect circuit according to claim 3, wherein said transition detect circuit includes:
   a first flip-flop coupled to receive said MSB at an input;
   a second flip-flop coupled to an output of said first flip-flop;
   a logic element coupled to logically combine an output of said first flip-flop with an output of said second flip-flop, said logic element having an output coupled to said reset input of said second counter.

6. A lock detect circuit according to claim 5, wherein said logic element is implemented using a NOR circuit.

7. A lock detect circuit according to claim 4, wherein said first binary state is a logic low and said second binary state is a logic high.

8. A lock detect circuit according to claim 4, wherein said first binary state is a logic high and said second binary state is a logic low.

9. A lock detect circuit according to claim 1, further comprising:
   a frequency differential validation circuit coupled to said output of said logic circuit and configured to detect at least two consecutive frequency lock conditions.

10. A lock detect circuit according to claim 9, wherein said frequency differential validation circuit comprises:
    a first flip-flop;
    a second flip-flop; and
    a logic element combining outputs of said first and second flip-flops;
    wherein said first flip-flop is coupled to said second flip-flop in series.

11. A lock detect circuit according to claim 10, wherein said logic element is implemented using a NAND circuit.

12. A lock detect circuit according to claim 9, further comprising:
    a data confirmation circuit coupled to an output of said frequency differential validation circuit and a data present signal.

13. A lock detect circuit according to claim 12, wherein said data confirmation circuit is implemented using an AND circuit.

14. A lock detect circuit according to claim 12, wherein said data confirmation circuit is implemented using a NAND circuit coupled in series with an inverter.

15. A frequency lock detect circuit for facilitating transitions between a phase-locked mode and a frequency-locked mode during operation of a phase-locked loop, comprising:
   a frequency differential determination circuit configured to determine whether a frequency differential between a first signal and a second signal falls within an adjustable predetermined threshold and generate a result therefor;
   a frequency differential validation circuit configured to check at least two results generated by said frequency differential determination circuit; and
   a data confirmation circuit configured to check a data present signal and an output of said frequency differential validation circuit.

16. A circuit according to claim 15, wherein said phase-locked mode is to be maintained when data is present and said at least two results indicate that said frequency differential falls within said adjustable predetermined threshold.

17. A circuit according to claim 15, wherein said frequency-locked mode is to be maintained when either no data is present or said at least two results indicate that said frequency differential falls outside of said adjustable predetermined threshold.

18. A circuit according to claim 15, wherein said at least two results are consecutive.

19. A circuit according to claim 15, wherein said first signal is an external reference signal.

20. A circuit according to claim 15, wherein said second signal is a signal generated by a voltage-controlled oscillator.

21. A circuit according to claim 15, wherein said circuit is implemented using CMOS logic.

22. A circuit according to claim 15, wherein said frequency differential determination circuit includes:
   a first counter having a binary output;
   a second counter having a reset control and a binary output;
   a step detector having an input and an output; and
   a bits checker having a binary input;
   wherein the most significant bit of said binary output of said first counter is coupled to said input of said step detector;
   wherein said output of said step detector is coupled to said reset control; and
   wherein said binary output of said second counter is coupled to said binary input of said bits checker.

23. A circuit according to claim 22, wherein said bits checker is implemented using an OR logic function.

24. A circuit according to claim 22, wherein said adjustable predetermined threshold is set by selectively coupling bits of said binary output of said second counter to said binary input of said bits checker.

25. A circuit according to claim 22, wherein said adjustable predetermined threshold is set to a high value by selectively coupling the bits of said binary output of said second counter to said binary input of said bits checker.

26. A circuit according to claim 15, wherein said frequency differential validation circuit include:
   a first flip-flop;
   a second flip-flop; and
   a logic element;
   wherein an output of said frequency differential determination circuit is coupled to an input of said first flip-flop;
   wherein an output of said first flip-flop is coupled to an input of said second flip-flop; and
   wherein said output of said first flip-flop and an output of said second flip-flop are coupled to an input of said logic element.

27. A circuit according to claim 26, wherein said logic element is implemented using a NAND circuit.

28. A circuit according to claim 15, wherein said data confirmation circuit includes:
   a logic element;
   wherein said output of said frequency differential validation circuit and said data present signal are coupled to said logic element.

29. A circuit according to claim 28, wherein said logic element is implemented using an AND circuit.

30. A circuit according to claim 28, wherein said logic element is implemented using a NAND circuit coupled in series with an inverter.

31. A device for controlling transitions between a phase-locked mode and a frequency-locked mode during operation of a phase-locked loop, comprising:
   a first counter;
   a second counter;
   a step detector;
   a bits checker;
   a first flip-flop;
   a second flip-flop;
   a NAND logic function; and
   an AND logic function;
   wherein a most significant bit of a binary output of said first counter is coupled to an input of said step detector;
   wherein an output of said step detector is coupled to a reset control of said second counter;
   wherein a binary output of said second counter is coupled to a binary input of said bits checker;
   wherein an output of said bits checker is coupled to an input of said first flip-flop;
   wherein an output of said first flip-flop is coupled to an input of said second flip-flop;
   wherein said respective outputs of said first and second flip-flops are coupled to an input of said NAND logic function; and
   wherein an output of said NAND logic function and a data present signal are coupled to said AND logic function.

32. A device according to claim 31, wherein said first counter is driven by a first signal and said second counter is driven by a second signal.

33. A device according to claim 32, wherein said first signal is an external reference signal.

34. A device according to claim 32, wherein said second signal is a signal produced by a voltage-controlled oscillator.

35. A device according to claim 31, wherein said first and second counters respectively engage in a count sequence in a cyclic manner.

36. A device according to claim 35, wherein said second counter initiates said count sequence when said most significant bit of said binary output of said first counter changes from one state to a different state.

37. A device according to claim 36, wherein said count sequence is a count-down sequence.

38. A device according to claim 37, wherein said one state is a low logic signal and said different state is a high logic signal.

39. A device according to claim 31, wherein bits of said binary output of said second counter are selectively coupled to said binary input of said bits checker to provide an adjustable threshold.

40. A method for detecting frequency lock for a phase-locked loop, comprising:

generating a first binary count in response to a first signal;

detecting a first transition of MSB of said first binary count;

initiating a second binary count in response to said detected transition and a second signal;

detecting a second transition of said MSB of said first binary count;

stopping said second binary count in response to said detected second transition; and examining a selected number of bits of said stopped second binary count to determine whether there is a frequency lock condition between said first and second signals.

41. A method for detecting frequency lock for a phase-locked loop according to claim 40, further comprising:

recording two consecutive results from said examining step; and checking said two consecutive results to validate that said frequency lock condition is not an error.

42. A method for detecting frequency lock for a phase-locked loop according to claim 41, further comprising:

checking whether data is present for detection; and setting a control signal in accordance with outcomes of said checking steps.

43. A method for controlling transitions between a phase-locked mode and a frequency-locked mode during operation of a phase-locked loop, comprising:

determining whether a frequency differential between a first signal and a second signal falls within an adjustable predetermined threshold;

checking at least two results generated by said determining step;

checking whether data is present; and providing a control signal based on outcomes of said checking steps to control said transitions between said phase-locked mode and said frequency-locked mode.

44. A method according to claim 43, wherein said at least two results are consecutive.

45. A method according to claim 43, wherein said phase-locked mode is to be maintained only when data is present and said at least two results indicate that said frequency differential falls within said adjustable predetermined threshold.

46. A method according to claim 43, wherein said frequency-locked mode is to be maintained when either no data is present or said at least two results indicate that said frequency differential falls outside of said adjustable predetermined threshold.

47. A method for controlling transitions between a phase-locked mode and a frequency-locked mode during operation of a phase-locked loop, comprising:

setting a predetermined threshold;

determining whether a frequency differential between a first signal and a second signal falls within said predetermined threshold;

checking at least two consecutive results generated by said determining step;

checking a data present signal to determine whether data is present; and setting a control signal to maintain said frequency-locked mode if said data present signal indicates that no data is present or if said at least two results indicate that said frequency differential falls outside of said predetermined threshold, otherwise, setting said control signal to maintain said phase-locked mode when said data present signal indicates that data is present and said at least two results indicate that said frequency differential falls within said predetermined threshold.

* * * * *